United States Patent [19]

Snyder et al.

[11] 4,356,619
[45] Nov. 2, 1982

[54] CUT AND CLINCH HEAD ASSEMBLY

[75] Inventors: Michael D. Snyder, Chenango Bridge, N.Y.; Henry J. Soth, Brackney, Pa.

[73] Assignee: Universal Instruments Corporation, Binghamton, N.Y.

[21] Appl. No.: 148,836

[22] Filed: May 12, 1980

[51] Int. Cl.$^3$ .......................... B23P 19/00; H05K 3/30
[52] U.S. Cl. ..................................... 29/566.3; 29/739; 140/105
[58] Field of Search .................... 29/566.1, 566.3, 715, 29/739, 741, 56.6; 140/93 D, 105

[56] References Cited

U.S. PATENT DOCUMENTS 3,986,533 10/1976 Woodman, Jr. .................. 140/105
4,125,136 11/1978 Olcese et al. ..................... 140/105
4,165,557 8/1979 Taguchi et al. ................... 29/566.3

Primary Examiner—Z. R. Bilinsky
Attorney, Agent, or Firm—Fidelman, Wolffe & Waldron

[57] ABSTRACT

An improved head assembly, for an electronic component lead cutting and clinching mechanism, having an improved construction for detection of lead absence or presence incorporating pivotal anvils which complete electrical circuits during the cutting and/or clinching of the component leads. The pivotal anvils cooperate with pivotal cutter-former arms which are actuated by a reciprocable driver. The driver includes a receiving and orienting tip for aligning the scrap portions of the leads for evacuation from the head assembly. Adjustable eccentric pins allow adjustment of the anvils for manufacturing tolerance corrections and for lead receiving orifice corrections.

5 Claims, 8 Drawing Figures

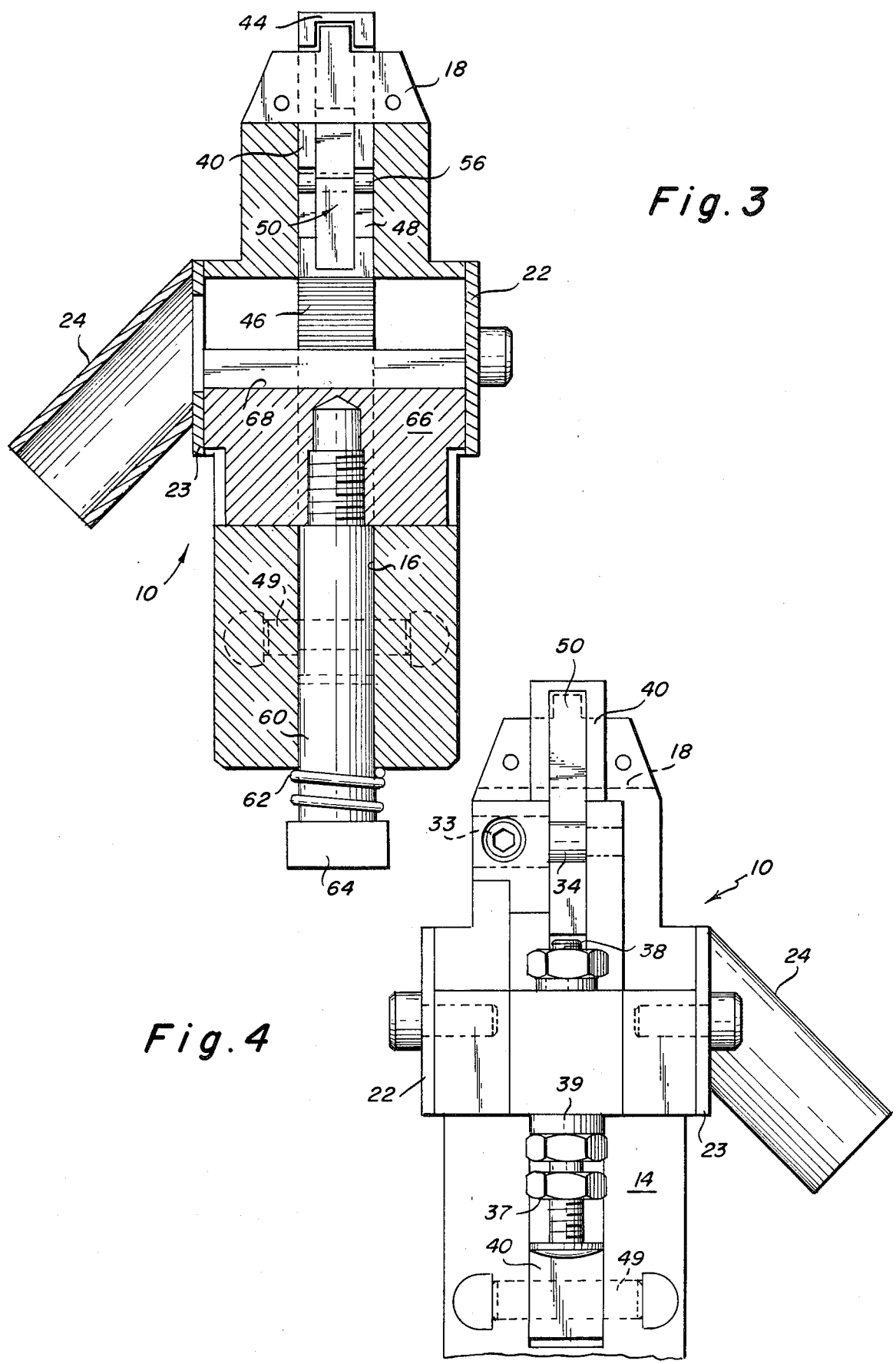

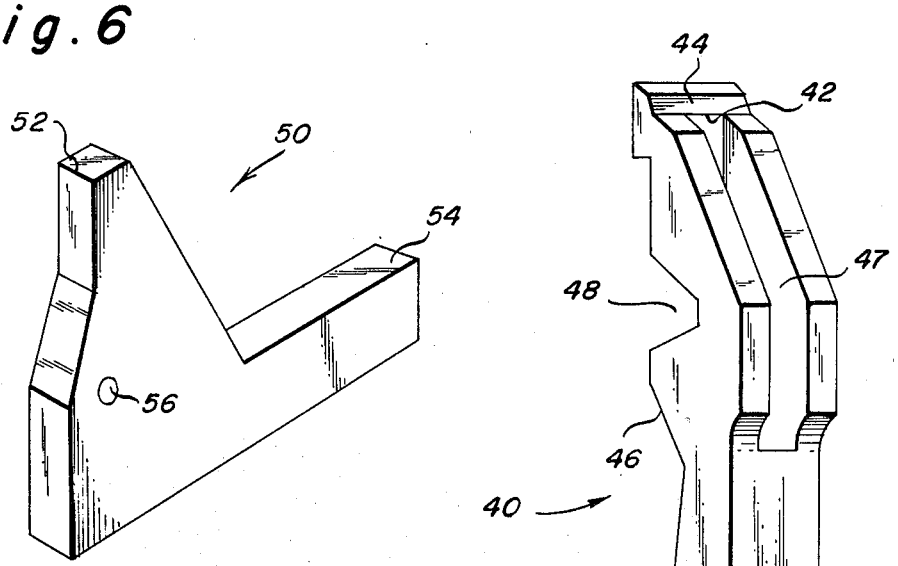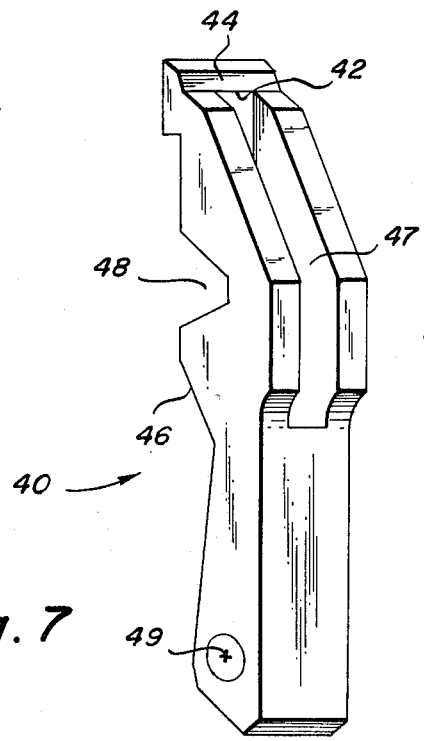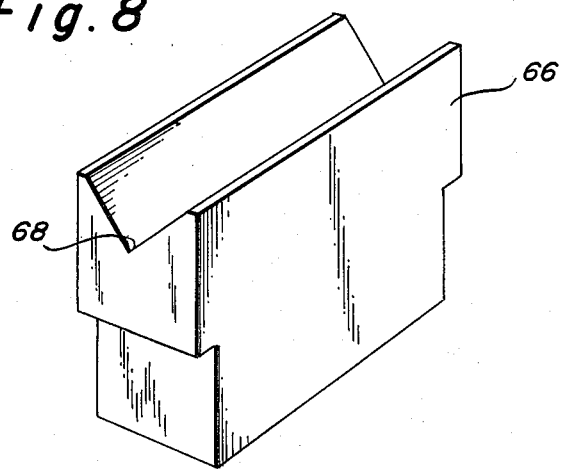

CUT AND CLINCH HEAD ASSEMBLY

CROSS REFERENCE TO RELATED ART

This invention is an improvement over the electronic component lead cut and clinch mechanism shown and disclosed in U.S. application Ser. No. 109,874 entitled "LEAD CUT AND OUTWARD CLINCH MECHANISM" filed Jan. 7, 1980. U.S. Pat. No. 3,646,659 entitled "LEAD CUT AND CLINCH MECHANISM" filed on Sept. 8, 1970 is also directed to the related art. The contents of these applications are hereby incorporated by reference.

BRIEF SUMMARY OF THE INVENTION

In the industry of electronic component assembly and insertion, a major step comprises inserting components into circuit boards and severing the extra lead material (needed for handing and processing of the components up to and including insertion) and clinching the remaining lead portions to the underside of the circuit board.

A major improvement over the prior art is shown and described in the application of the above referenced U.S. Ser. No. 872,726, to which the improved head assembly of the instant invention is particularly adaptable.

It is an object of the present invention to provide an improved apparatus for detecting the presence of component leads, within the head assembly, to be cut and clinched.

It is another object of this invention to provide an improved apparatus for handling the scrap portions of the leads that remain after the cutting operation, and which must be disposed of in a manner that will prevent jamming of the various moving parts of the head assembly.

These and other objects of the invention will be readily apparent during the following detailed discussion taken with reference to the drawings, in which:

FIG. 1 discloses the improved head assembly of the instant invention adapted to a prior art support which is shown in phantom lines.

FIG. 3 is a sectional view along the lines 3—3 of FIG. 2.

FIG. 4 is a right side elevation of the head assembly of FIG. 1.

FIG. 6 is an isometric view showing the details of one of the anvils of the invention.

FIG. 7 is an isometric view showing the details of one of the cutter-former arms of the invention.

FIG. 8 is an isometric view showing the details of the bifurcated tip of the driver.

Similar reference characters refer to similar parts throughout the several views of the drawings.

DETAILED DESCRIPTION OF THE DRAWINGS

Figure 1:
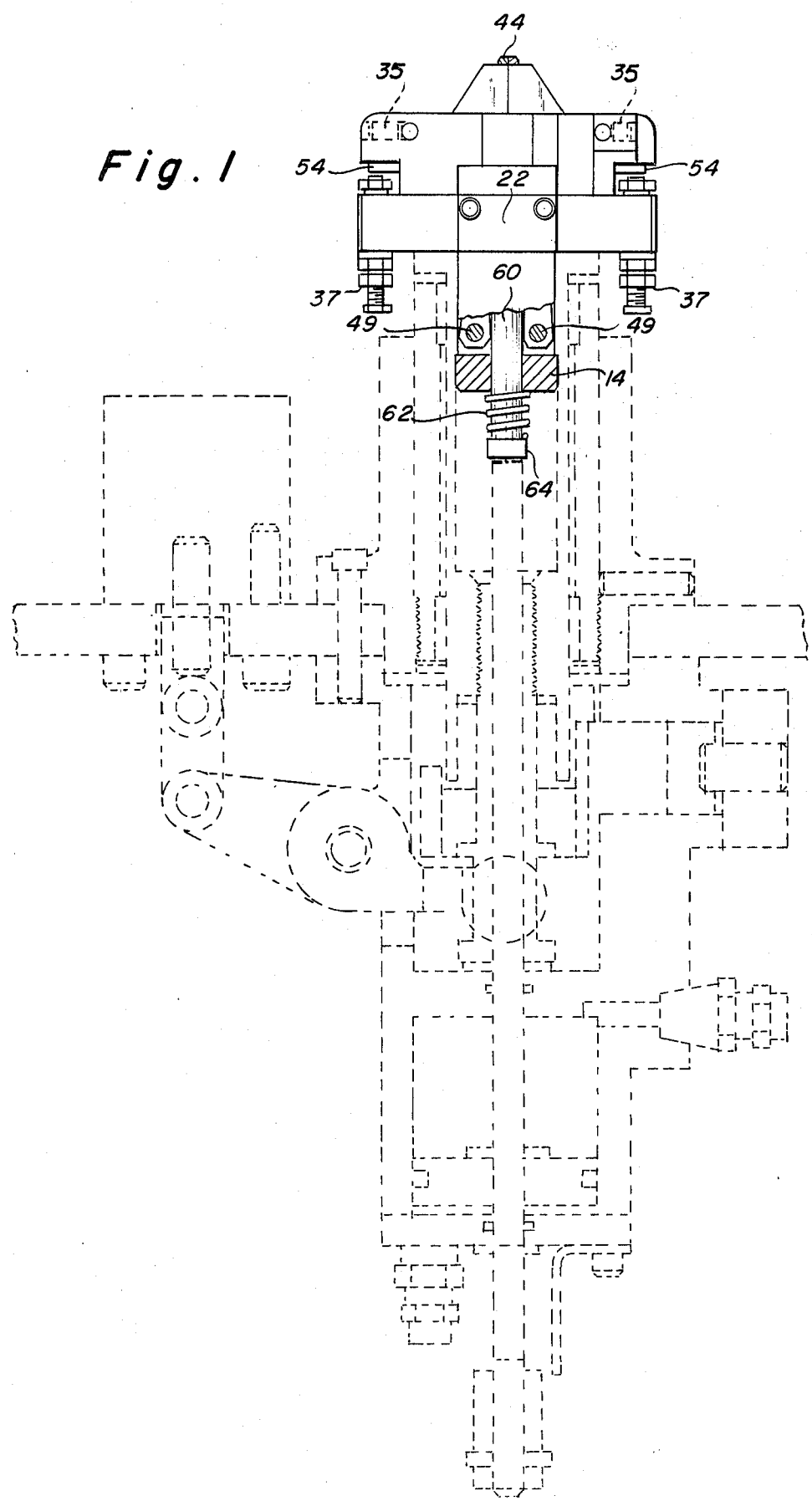

Reference is now made to one embodiment of the invention, as indicated in the attached drawings. In these drawings, for duplicate parts performing the same function, only that part which is most easily seen in the drawing has been numbered.

Referring to FIG. 1, the new cut and clinch head assembly 10 is shown in solid lines with the prior art support and actuating mechanism shown in phantom lines, to indicate the improvement over the prior art.

Figure 2:
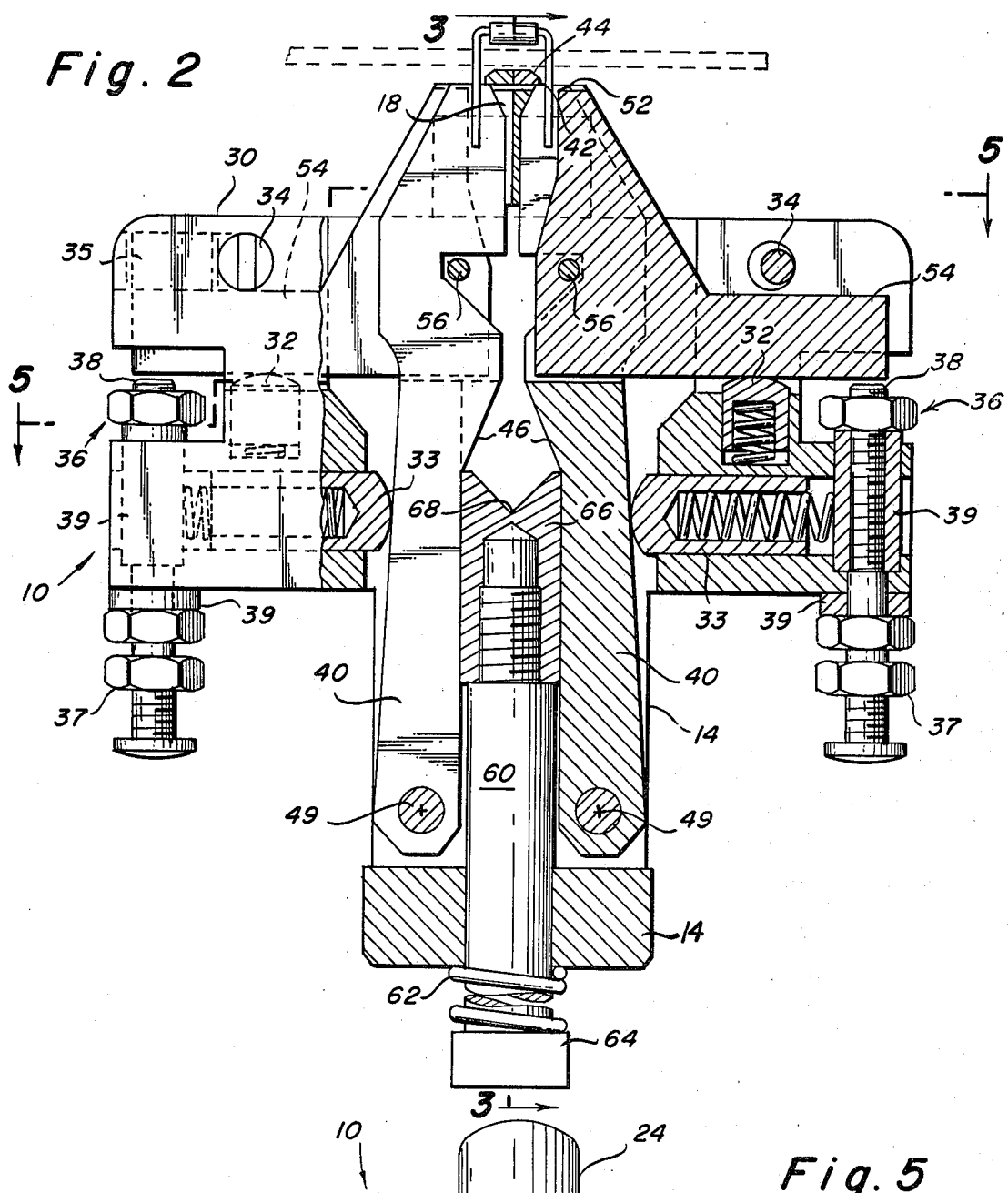
FIG. 2 is a sectional view, partially broken away, along the lines 2—2 of FIG. 5. Additionally, a printed circuit board and component are shown in phantom lines.
Figure 5:
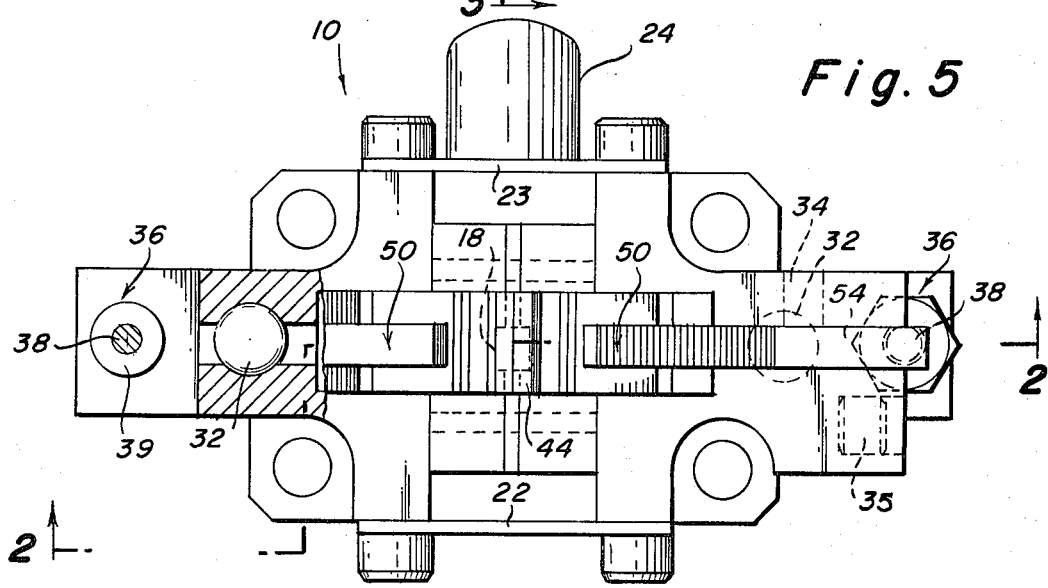
FIG. 5 is a sectional view taken along the lines 5—5 of FIG. 2.

With reference to FIGS. 2-4, the head assembly 10 comprises a housing having a generally tubular lower extension 14 with a bore 16 therein and a guide/stop 18. The housing also includes lateral wings 30 containing spring biased plungers 32 and 33, adjustable eccentric pins 34 (with adjustment set screws 35), and lead detectors 36. Lead detectors 36 include a pan head screw and nut arrangement 37 with insulators 39, the top contact portion of the lead detectors indicated as 38. As best seen in FIGS. 3 and 4, the housing also includes a cover plate 22 and a duct plate 23 with attached duct 24. The housing also includes cutter-former arms 40 pivotally supported at 49, anvils 50 pivotally supported at 56, and vertically reciprocable driver 60.

As best seen in FIG. 6, each anvil 50 has a cutting surface 52 and a lateral extension 54.

As best seen in FIG. 7, each cutter-former 40 includes a cutting surface 42, a forming surface 44, a camming surface 46, window 47, and relief portion 48.

As best seen in FIGS. 2, 3, and 8, driver 60 includes a bifurcated tip 66 at the upper end thereof. The juncture of bifurcation is indicated as 68. Driver 60, which may take the form of a machine screw, is biased to the downward position by a compression spring 62 which is in contact with the bottom of tubular lower extension 14 and head 64. The size of bifurcated tip 66, relative to the size of bore 16, prevents driver 60 from falling out of the housing when the head assembly is removed from the phantom line support of FIG. 1. In this regard, head 64 is forced into engagement with the top of the actuator rod of the phantom line prior art device by spring 62 when head assembly 10 is mounted for operation.

FIG. 2 further discloses the head assembly 10 in operation relationship with an electronic component, the leads of which have been inserted through holes in a printed circuit board; the electronic component and the printed circuit board are shown in phantom lines at the top of head assembly 10. As can be seen from FIG. 2, when the head assembly is raised into engagement with the underside of the printed circuit board, the leads of the component project down into the head assembly between the cutter-former arms 40 (when in their "open" positions) and the anvils 50 (when in their "receive" positions). The arrangement of the various parts of head assembly 10 are cooperatively arranged or intermeshed such that, upon cutting of the leads, the scrap portions will fall down to and in engagement with bifurcated tip 66, there being no slack spaces between cutter-formers 40 and anvils 50 for the scrap portions to become jammed in.

OPERATION OF THE INVENTION

In operation, the printed circuit board with components mounted thereon is positioned above head assembly 10 (as by an X-Y positioning system). Upon command, head assembly 10 is raised to receive the downwardly projecting leads of the component, as seen in FIG. 2. Upon further command, driver 60 is raised upwardly into engagement with camming surfaces 46 to drive cutter-former arms 40 outwardly such that cutting surfaces 42 engage with the leads of the component, driving them into engagement with cutting surfaces 52 of anvils 50. Further outward movement of cutter-formers 40 forces the leads to engage anvils 50, causing anvils 50 to pivot about point 56. As anvils 50 pivot, lateral arms 54 are forced into engagement with top contacts 38 of the lead detecting device 36 to complete a ground for a lead detect indicating circuit (not shown). Further outward movement of cutter-former arms 40 causes the leads to be cut such that scrap portions may fall through the center of the device to bifurcated tip 66. As cutter-former arms 40 continue to pivot outwardly, forming surfaces 44 engage the remaining portions of the leads to bend them outwardly into engagement with the underside of the printed circuit board (nominally, at a minimum of 60° to the bottom of the printed circuit board).

The adjustment of anvils 50 is accomplished by adjustable eccentric pins 34 (locked into adjusted position by set screws 33) to remove manufacturing tolerances and set the clearances between cutter-former arms 40 and anvils 50 for reception of the leads of the component. The scrap portions of the leads, having dropped down to bifurcated tip 66, have their longitudinal axes aligned parallel to this juncture of bifurcation 68. This alignment function is accomplished in order that the scrap portions may not become jumbled and block the exit port to duct 24. Duct 24 may have an vacuum line or the like (not shown) attached thereto for evacuation of the scrap portions of the leads. Spring 62 returns driver 60 to the downward position in the absence of an upward driving force. Spring plungers 32 and 33 return anvils 50 and cutter-formers 40, respectively, to their positions for receiving leads.

While only one embodiment of the invention has been shown and described, it is obvious that many changes and modifications will be apparent to those of ordinary skill in the art without departing from the scope of the appended claims.

Thus, it will be seen that the objects set forth above, among those made apparent from the preceeding description, are efficiently attained and, since certain changes may be made in carrying out the above method and in the construction set forth without departing from the scope of the invention, it is intended that all matter contained in the above description or shown in the accompanying drawings should be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed as new and is desired to be secured by Letters Patent is:

1. In an apparatus for cutting component leads projecting beneath a printed circuit board to form scrap portions and remaining portions and for clinching said remaining portions to the underside of said printed circuit board, and having a head assembly adapted to engage with said underside of said printed circuit board and to receive said leads for cutting and clinching, and having an actuator means for transmitting a cut and clinch function drive, the improvement comprising:
   a housing supporting cutter-former means and anvil means for cooperatively receiving and cutting said leads and for clinching said remaining portions to said underside;
   said cutter-former means, pivotal between an open position and a closed position, having a first cutter surface adapted to engage said leads during cutting of said leads;
   said anvil means, pivotal between a receive position and a detect position, having a second cutting surface adapted to engage said leads and cooperate with said cutter-former means during said cut and clinch function; and
   adjustable limiter means for limiting the amount of pivoting of said anvil means to said receive position, said limiter means comprising an adjustable eccentric means for engaging said anvil means to adjustably limit the amount of pivoting of said anvil means toward said receive position.

2. In an apparatus for cutting component leads projecting beneath a printed circuit board to form scrap portions and remaining portions and for clinching said remaining portions to the underside of said printed circuit board, and having a head assembly adapted to engage with said underside of said printed circuit board and to receive said leads for cutting and clinching, and having an actuator means for transmitting a cut and clinch function drive, the improvement comprising:
   a housing supporting cutter-former means and anvil means for cooperatively receiving and cutting said leads and for clinching said remaining portions to said underside;
   said housing comprising a driver engageable with said actuator means and spring biased away from a camming position, means for receiving said scrap portions, and an exit port for evacuation of said scrap portions;
   said driver comprising aligner means for receiving and aligning the longitudinal axes of said scrap portions in said housing to prevent jamming of said exit port;
   said cutter-former means, pivotal between an open position and a closed position, having a first cutter surface engageable with said leads during cutting of said leads and a camming means for engagement with said driver in said camming position to drive said cutter-former means to said closed position;
   said anvil means, pivotal between a receive position and a detect position, comprising a second cutting surface engageable with said leads and cooperable with said cutter-former means during said cut and clinch function and a mechanically actuateable switch contact; and
   a detect means comprising an electrical circuit which is completed by said anvil means contact when in said detect position.

3. An apparatus as in claim 2, wherein said aligner means comprises a bifurcated tip attached to said driver and opening upwardly whereby said scrap portions will fall to the juncture of bifurcation to align their longitudinal axes.

4. An apparatus as in claim 2, wherein said cutter-former means further comprises:
   a forming means, cooperating with said anvil means, for engaging and forcing said remaining portion toward said underside to a clinched position;
   a first bias means for biasing said cutter-former means to said open position;
   a second bias means for biasing said anvil means toward said receive position; and
   a stop means for limiting the amount of pivoting of said cutter to said open position.

5. In an apparatus for cutting component leads projecting beneath a printed circuit board to form scrap portions and remaining portions and for clinching said remaining portions to the underside of said printed circuit board, and having a head assembly adapted to engage with said underside of said printed circuit board and to receive said leads for cutting and clinching, and having an actuator means for transmitting a cut and clinch function drive, the improvement comprising:

- a housing supporting cutter-former means and anvil means for cooperatively receiving and cutting said leads and for clinching said remaining portions to said underside;
- said cutter-former means, pivotal between an open position and a closed position, having a first cutter surface adapted to engage said leads during cutting of said leads;
- said anvil means, pivotal between a receive position and a detect position, having a second cutting surface engageable with said leads in a lead receiving and cutting area to cooperate with said cutter-former means during said cut and clinch function;
- detect means, changeable in state, for indicating engagement of a lead with said anvil means during said cut and clinch function, said detect means comprising an electrical circuit which is completed by said anvil means when in said detect position; and
- contact means on said anvil means for completing said circuit, said contact means normally open when said anvil is in said receive position and comprising a portion of said anvil means which is distal from said lead receiving and cutting area;
- whereby particles which enter said lead receiving and cutting area will not cause misdetection of said leads.

* * * * *